(12) United States Patent  
Volkerink et al.

(10) Patent No.: US 7,378,860 B2
(45) Date of Patent: May 27, 2008

(54) WAFER TEST HEAD ARCHITECTURE AND METHOD OF USE

(75) Inventors: Erik Volkerink, San Jose, CA (US); Duncan Gurley, San Jose, CA (US); Ajay Khoche, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/525,731

(22) Filed: Sep. 22, 2006

(65) Prior Publication Data

US 2008/0088326 A1 Apr. 17, 2008

(51) Int. Cl.
 *G01R 31/02* (2006.01)
(52) U.S. Cl. ...................................................... 324/754
(58) Field of Classification Search ......... 324/754–765
 See application file for complete search history.

(56) References Cited

U.S. PATENT DOCUMENTS 4,517,512 A * 5/1985 Petrich et al. .............. 714/724
5,424,651 A * 6/1995 Green et al. ................ 324/754
5,747,994 A * 5/1998 Suga ........................ 324/158.1
5,931,048 A * 8/1999 Slocum et al. ........... 74/490.07
6,462,532 B1 * 10/2002 Smith ....................... 324/158.1
7,274,196 B2 * 9/2007 Yun ........................... 324/754
7,278,079 B2 * 10/2007 Evans ........................ 714/740

* cited by examiner

*Primary Examiner*—Ha Nguyen
*Assistant Examiner*—Karen M Kusumakar
(74) *Attorney, Agent, or Firm*—Howison & Arnott, L.L.P.

(57) ABSTRACT

A wafer test head and ATE for testing semiconductor wafers. The wafer test head having a plurality of sides that can each be used to test a different semiconductor wafer. The architecture of the wafer test head enables electrical connections to probe card located on two different sides of the wafer test head. Multiple silicon wafers can be tested for proper functionality at the same time or in an interleaved fashion via a single multi-sided wafer test head. The internal architecture of an exemplary wafer test head allows printed circuit cards to be able to electrically connected to multiple wafer test locations on a single wafer test head.

14 Claims, 8 Drawing Sheets

WAFER TEST HEAD ARCHITECTURE AND METHOD OF USE

BACKGROUND OF THE INVENTION

Description of Related Art

The present invention relates generally to the field of automated test equipment (ATE). More specifically, the present invention relates to wafer test equipment having wafer test heads that probe and test the various circuits found on a manufactured wafer.

Traditional ATE equipment tests only a portion of an integrated circuit wafer at a time. Such ATE used to test wafers is fairly large, and has a wafer test head of about a meter by a meter by about one-half a meter in dimensional size. An ATE wafer test head even with its large size and electronics contained therein can only test part of a one wafer at a time.

In the arena of microelectronics, a wafer is a thin slice of semiconducting material, such as silicon crystal, upon which microcircuits are constructed by doping, etching, and the deposition of various materials. Wafers are thus of key importance to the fabrication of semiconductor devices such as integrated circuits.

Wafers are generally round in shape and are made in various sizes ranging from about 24 mm to about 300 mm in diameter. They have a thickness in the order of about 0.5 mm. A multitude of separate integrated circuits can be manufactured on a single wafer. The integrated circuits on a wafer require detailed testing to make sure each circuit is functional. During mass production of integrated circuits, it is least expensive to test all the integrated circuits on a wafer prior to dicing the wafer into its individual integrated circuits. Large automated testing devices are required to test a single wafer. Traditional automated test equipment (ATE) operates on a single wafer at a time and tests only a part of the wafer at a time. The increasing quantity requirements and cost pressures placed on the manufacturing of integrated circuits at high volumes requires additional advanced ATEs. Purchasing additional ATEs creates additional test sites on the manufacturing floor and aides the handling of high product throughput, but also increases costs and requires additional manufacturing facility space.

FIG. 1 depicts a prior art wafer test head architecture 10. The wiring within the wafer test head is not depicted for clarity purposes. The wafer test head 10 has a back side 12 and a front side 14. A casing 16 substantially encloses the wafer test head. A wiring hole 18 is located in the back side 12 of the wafer test head. The wiring hole 18 is used to allow cabling and wiring to enter and exit the test head for connection to the circuitry within. The front side of the test head 14 has a panel, which is not shown in FIG. 1 so that the interior architecture of the test head 10 can be seen.

A back plane 20 is positioned substantially parallel to the back side 12 of the test head 10. The back plane 20 includes a plurality of connectors (not specifically shown) that receive a plurality of printed circuit cards (PCBs) or other cartridges 22. The PCBs 22 include circuitry that is used for testing a wafer. Each PCB 22 has a connector 24 that is used to connect wiring to circuitry on the front side 14 of the wafer test head 10. The front side 14 of the wafer test head 10 may include a wafer probe card (not specifically shown in this Figure). The wafer is clamped to a chuck in the wafer prober and is pushed against the probe card. Probes on the wafer test card (probe card) can be used to help test various circuits and functions on the wafer.

In the prior wafer test head architecture 10, only a single probe card can be connected to the wafer test head 10. Thus, only a single wafer can be tested at a time.

FIG. 2 depicts a portion of the architecture within the traditional prior art wafer test head architecture 10. The back plane 20 has a plurality of connectors 24 on one of its surfaces. Connected to the connectors 24 are PCBs 22 that incorporate circuitry used for testing a wafer while it is electrically and physically connected to the wafer test head 10. On one edge 26 of each PCB 22 are electrical connections (indicated by arrows 28) that are used to connect to the wafer probe card on the front side 14 of the wafer test head 10. The architecture of the prior art's wafer test head 10 limits a wafer test head to testing a single wafer on one side of the wafer test head.

What is needed is a wafer test head that has an architecture allowing multiple wafers to be tested on a single wafer test head either simultaneously or in an interleaved fashion so that the testing of wafers can be performed in a more streamlined fashion, so that device under test (DUT) throughput is optimized, and so that each wafer test station's usefulness is further maximized.

SUMMARY OF THE INVENTION

Exemplary embodiments of the present invention provide a wafer test head architecture that enables testing of multiple wafers on a single test head. The wafers may be tested simultaneously or in an interleaved fashion. A resulting test head enables a more efficient and streamlined manufacturing and test facility for integrated circuits without increasing the number pieces of ATE or required floor space in the manufacturing facility.

One embodiment of an exemplary multisided wafer test head includes a front and a back panel. Each panel provides electrical connections for testing a first and a second wafer respectfully. Between the front and the back panel are printed circuit boards (PCBs) containing circuitry for testing wafers. Each PCB is positioned to have a first connector near the front panel and a second connector near the back panel. Each PCB can be electrically connected to both the front panel and the back panel in order to test wafers. At least one backplane is positioned to electrically connect to each of the PCBs between said first connector and said second connector. All the PCBs may be substantially identical although some of the PCBs may have specialized circuitry different from the other ones of the PCBs. The specialized circuitry may be for testing predetermined aspects of the circuitry on a wafer under test. The PCBs are used in the wafer test head to test wafers placed on both the front and back panel of the wafer test head.

Other embodiments of the exemplary wafer test head that can test multiple wafers provide a method of testing multiple wafers at the same time or in an interleaved fashion. The method comprises electrically probing a first wafer at a first wafer test location on a wafer test head. Then testing a plurality of circuits on the first wafer for proper functionality. Meanwhile, probing a second wafer at a second location on the wafer test head. And, testing a plurality of circuits on the second wafer for proper functionality. Hence, during the connection of the second wafer (also called index time) the other wafer is being tested (i.e., the index time is hidden and throughput improves significantly). The same PCBs inside the wafer test head are used to test the both the plurality of circuits on the first wafer and the plurality of circuits on the second wafer.

Many of these features and advantages, as well as others, will become more apparent from the description below with reference to the following drawings.

BRIEF DESCRIPTION OF THE DRAWINGS

The disclosed invention is described with reference to the accompanying drawings, which show important sample embodiments of the invention and which are incorporated in the specification hereof by reference, wherein.

DETAILED DESCRIPTION OF EXEMPLARY EMBODIMENTS

The numerous innovative teachings of the present invention will be described with particular reference to exemplary embodiments. However, it should be understood that these embodiments provide only a few examples of the many advantageous uses of the innovative teachings herein. In general, statements made in the specification do not necessarily delimit any of the various claimed inventions. Moreover, some statements may apply to some inventive features, but not to others.

Figure 1:
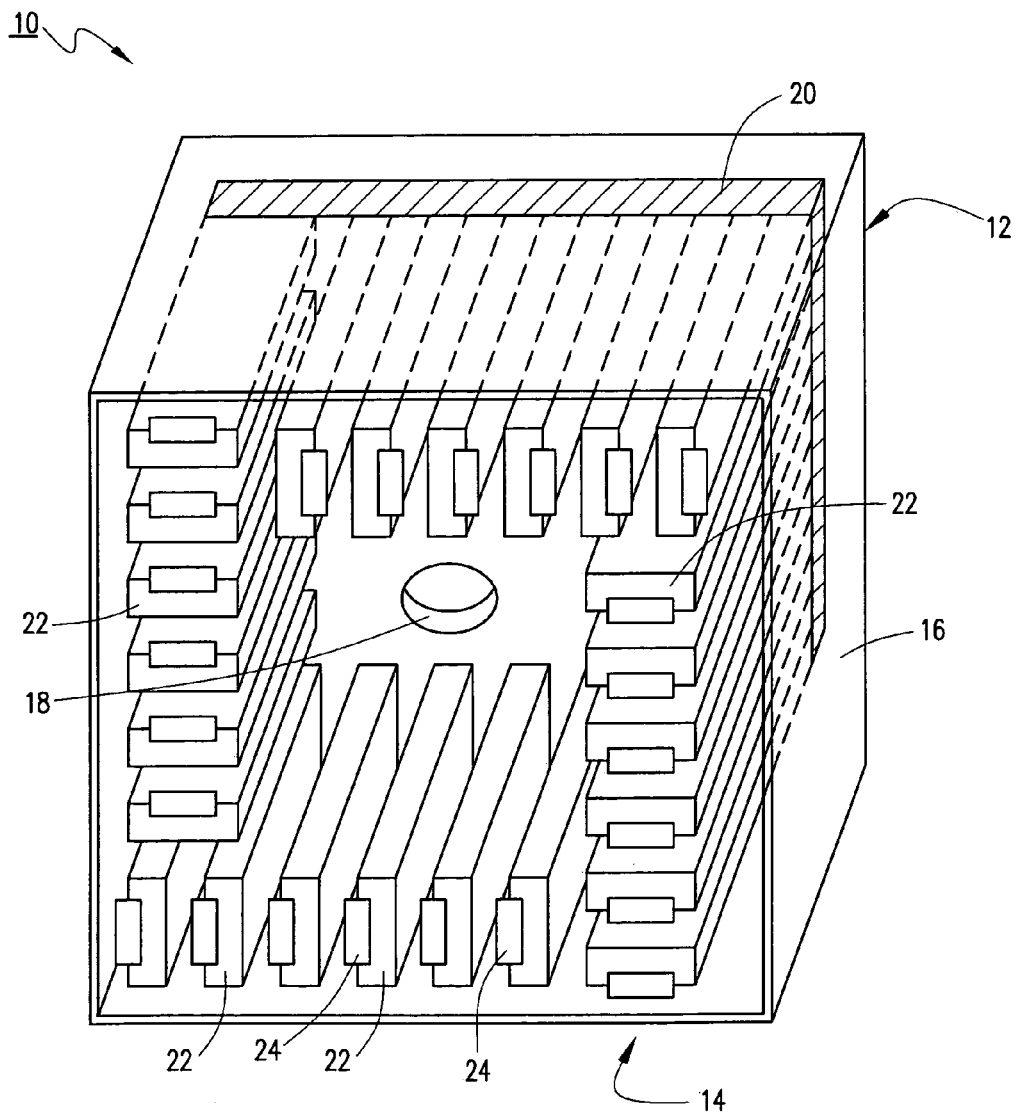
FIG. 1 depicts a prior art wafer test head architecture drawing.
Figure 2:
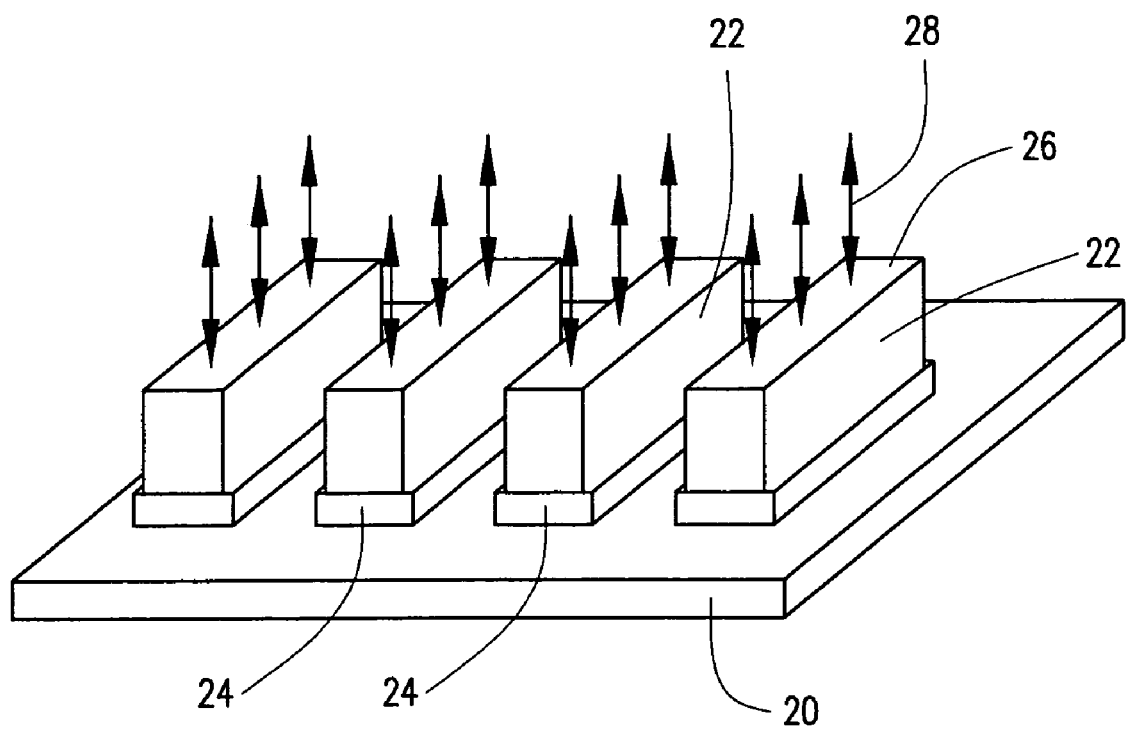
FIG. 2 depicts a prior art wafer test head back plane and print circuit board configuration.
Figure 3:
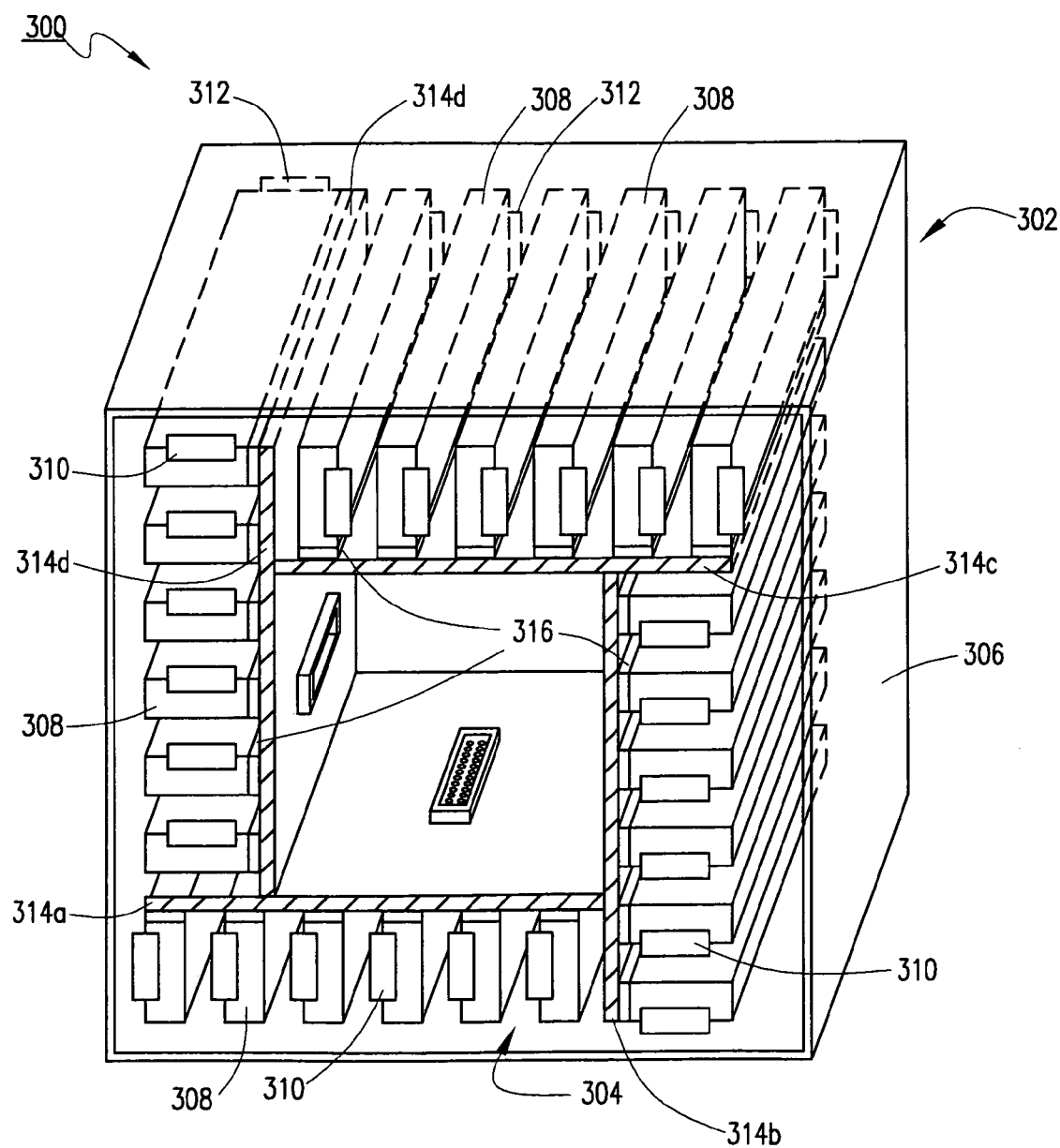
FIG. 3 depicts an exemplary wafer test head architecture in accordance with an embodiment of the invention.

FIG. 3 illustrates an exemplary wafer test head architecture 300 in accordance with an embodiment of the present invention. The exemplary wafer test head architecture has an enclosure 306. The enclosure substantially encloses the architecture inside. The enclosure 306 has both a back side 302 and a front side 304. A front panel, which is on the front side 304, and a back panel which, is on the back side 302 are not shown in this figure in order to decrease the clutter in FIG. 3. Inside the enclosure 306, there are a plurality of PCBs 308. Each of the PCBs 308 have an electrical connection or connector area on a first end of each PCB. Each of the PCBs 308 also have another electrical connection or connector at a second end of the PCB 308. The first end of the PCB 308 is in close proximity to the front side 304 and the second end of the PCB 308 is in close proximity to the back side 302 of the wafer test head 300.

In the depicted embodiment of the invention in FIG. 3, the first end has a connector 310 thereon while the second end has another connector 312 thereon. The connector on the first end 310 allows electrical connections between the PCBs 308 and a front panel on the front side 304 of the wafer test head architecture 300. The connector 312 on the second side of the PCB 308 allows for electrical connections to the test panel on the back side 302 of the wafer test head 300.

Each of the PCBs 308 electrically connect to a back plane 314a, 314b, 314c, and 314d. The back plane 314a-d is shown in this embodiment to be substantially perpendicular to the front or back side of the wafer test head 300. This exemplary architecture allows each of the PCBs 308 to electrically connect to a wafer probe card positioned on the front side 304 of the wafer test head as well as to a wafer probe card on the back side 302 of the wafer test head via connectors 310 and 312, respectively. Other embodiments of the invention may not require a backplane to be substantially perpendicular with either the front or back side of a wafer test head.

Each of the exemplary PCBs 308 comprise circuitry used to aid the testing of one or more wafers. The PCBs 308 also each have a connection or connector 316 that is located between the first end connector 310 and the second end connector 312. This connector 316, which is between the first end and second end connectors, is used in some embodiments of the invention to electrically connect the PCB to a back plane 314a-d. It is understood that in some embodiments of the invention the PCBs 308 may all be substantially identical PCB cards, but it is also understood that such PCB cards used for testing a wafer may include some specialized PCB cards for testing special functions of circuitry found on a wafer undergoing test. Circuitry in the PCB cards may be designed to aid the testing digital circuitry, analog circuitry, timing, temperature, data rates, error, functions, ringing, memory, capacity, data integrity, calculation integrity, signal integrity, and other test functions normally performed on integrated circuits found on wafers undergoing tests.

Still referring to FIG. 3, the back planes 314a-d are considered to be vertically mounted from the bottom (back panel) to the top (front panel) of the wafer test head 300. The back planes 314a-d further may divide the interior of the wafer test head into quadrants or sections wherein a plurality of the PCBs are connected to the back planes. Exemplary embodiments of the invention allow the PCBs 308 to have electrical wire or electrical connection access at both ends of the PCBs, which are positioned near to the front side and back side of the exemplary wafer test head 300. Thus, a probe card can be installed on both sides of the exemplary test head and increase the number of wafers that can be tested on the test head from one to two wafers. Thus exemplary test heads potentially doubles the capacity of a prior art wafer test head and more than doubles the efficiency of the wafer testing process (explained below).

Figure 4:
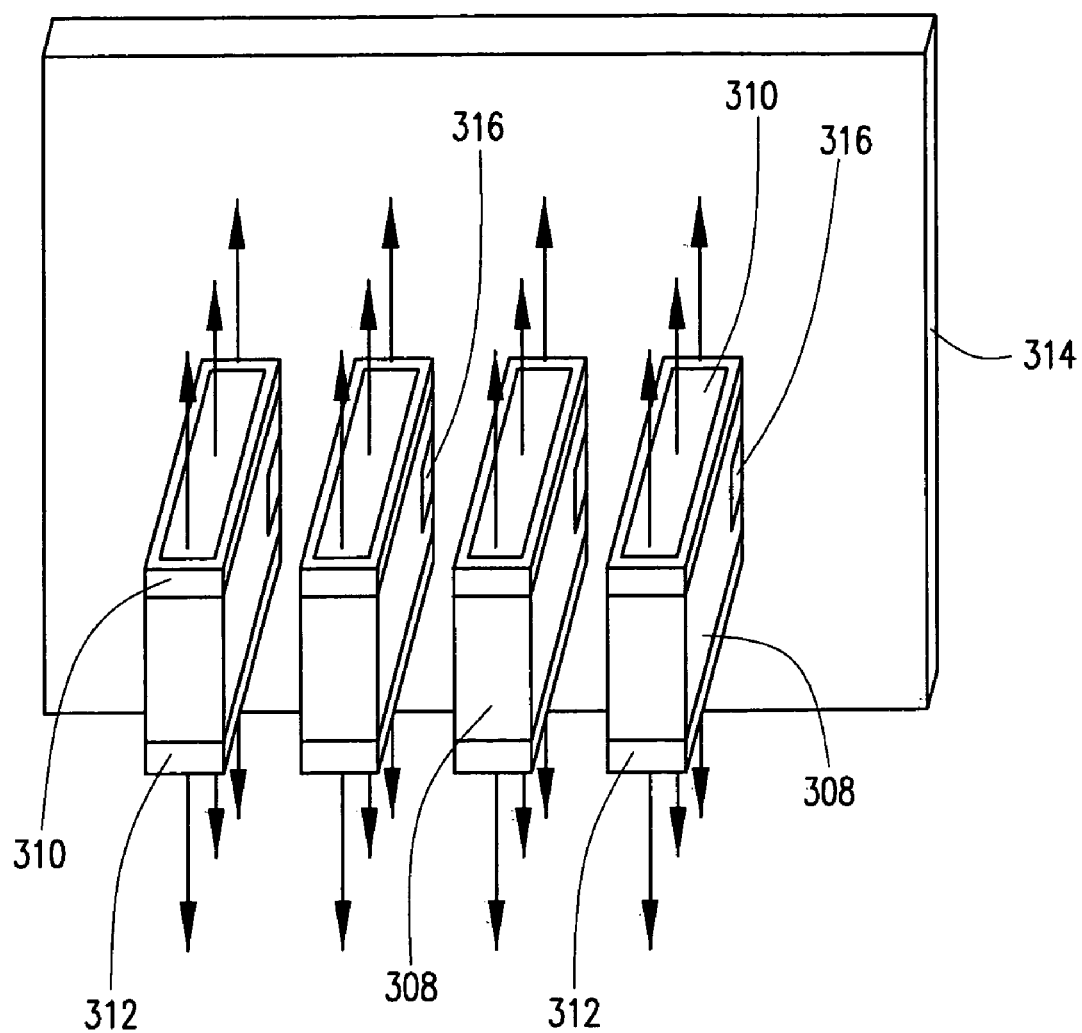
FIG. 4 depicts a back plane and PCB architecture for an exemplary wafer test head.

Referring now to FIG. 4, a back plane 314 is shown with four PCBs 308 connected thereon via a back plane connector 316. The PCBs 308 each have a first end connector 310 and a second end connector 312 on distal or opposite ends of the PCB. These connectors allow electrical connections or electrical access to both sides of the PCB and connections to both the front side 304 and back side 302 of the wafer test head 300. The PCBs 308 may all be substantially identical to each other, but may also be substantially different in order to test various different electronic aspects of the wafers under test.

Figure 5:
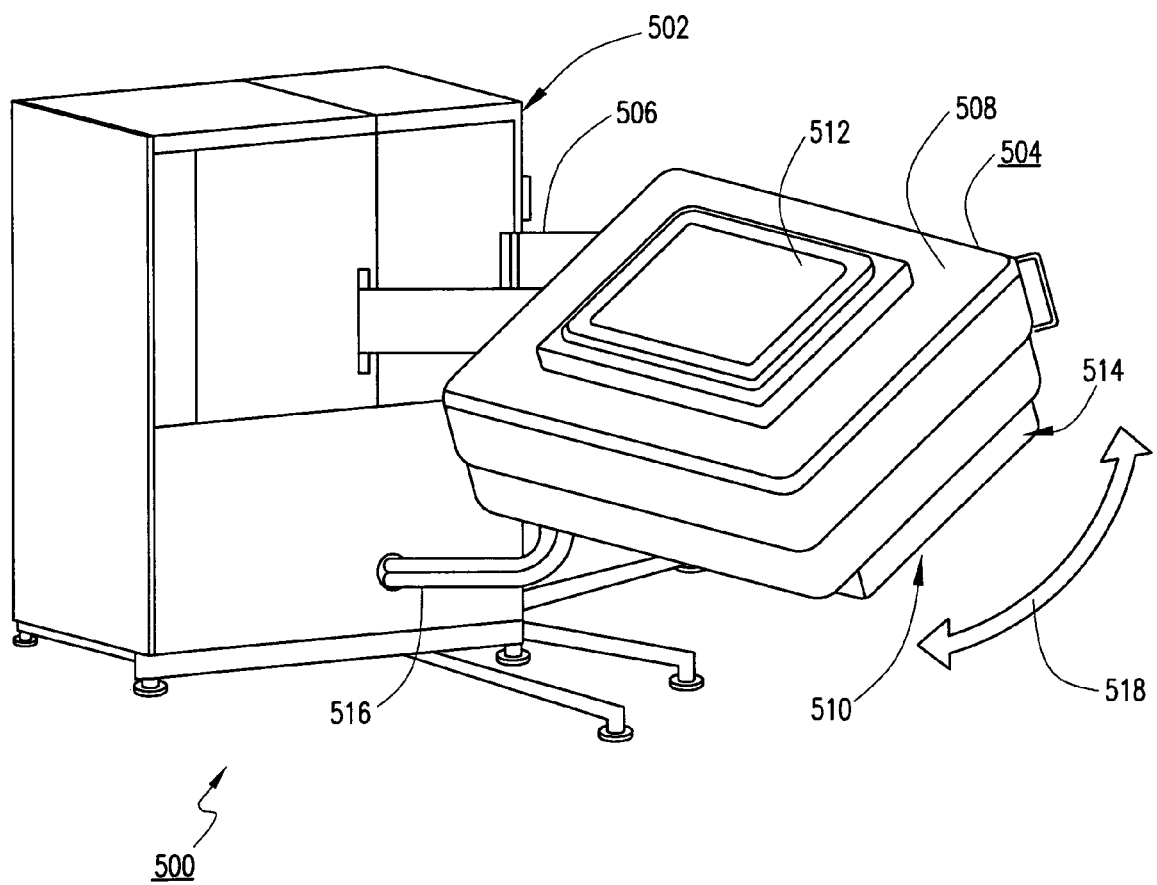
FIG. 5 depicts an exemplary a wafer Automated Test Equipment (ATE) that incorporates an exemplary wafer test head in accordance with embodiments of the invention.

Referring now to FIG. 5, an exemplary automated wafer testing device 500 is depicted. The exemplary wafer testing device 500 includes a main chassis 502 and a dual sided wafer test head 504. The dual sided wafer test head 504 is supported by at least one support arm 506, which moveably supports the wafer test head 504. The exemplary wafer test head 504 can be rotated from about 180° to about 360° in order to position the head for a user to place wafers on the front side 508 or the back side 510 of the exemplary wafer test head 504.

A first wafer probe card 512 is placed on top of a wafer (not specifically shown) on the front panel 508 to aid in testing of the wafer. A second wafer probe card 514 is positioned on the back side or panel of the wafer test head 504 to aid testing of a second wafer.

In high volume wafer testing, an extensive list of possible failures in the circuitry of the wafer are identified. Every node or place where such a failure, fault, or error can be detected in the manufactured integrated circuits on the wafer may be probed and tested in a manner that would determine whether or not a fault exists in the circuitry. There may be transition faults, timing faults or specific attributes of portions of each circuit to make sure that the entire circuit is working properly. Such tests may be considered both functional tests and/or structural tests. Test heads, in accordance with the embodiments of the present invention, attempt to test for every imaginable failure mode via extensive testing of the circuits on the wafer.

The main chassis 502 is electrically connected to the wafer test head 504 via cabling 516, which exits the bottom of the main chassis 502 and connects to a side or a corner section of the wafer test head 504.

A wafer to be tested is placed in contact with the wafer probe card either manually or by a wafer handler machine or device. It is envisioned that exemplary embodiments of the invention on an assembly line will use wafer handlers to place wafers to be tested on a wafer test head and to remove the wafers from the wafer test heads when testing of the wafer is completed. Still referring to FIG. 5, a first wafer may be placed on the front panel 508 of the wafer test head 504 and placed in contact with the wafer probe card 512. The first wafer may be held in place on the test head 504 using various means including, but not limited to, as a clamp, a chuck, a prober, a cassette, alignment pins or notches. Testing of the first wafer may then be initiated. While the first wafer is being tested, the wafer test head may be rotated as shown by the arrows 518 such that the back side of the wafer test head is facing up. The second wafer may be placed on the back side of the wafer test head and the wafer probe card 514 would be placed in contact therewith.

While the first wafer is being tested on the first side of the wafer test head 508, the second wafer may also be tested on the back side 510 of the wafer test head 504. The wafers may be tested simultaneously or the first wafer may be tested while the second wafer is being loaded (i.e. during the second wafer's index time). After the first wafer is tested, then the second wafer can immediately be tested while the first wafer is removed and a new wafer is put in on the first side 508 its place (i.e. during the first and third wafer's index time). As such, the testing of wafers can be done in an interleaved fashion on the same piece of expensive test equipment 502. Interleaving wafer testing on the same ATE 502 will greatly improve throughput of testing wafers and decrease costs and necessary floor space.

In other embodiments, the wafer may be contained within a wafer cassette. A wafer cassette is a known item in the industry although such items are still evolving with technology. A wafer cassette may be a wafer holder that a wafer is placed into so that the wafer can be easily transported between testing devices, burning-in devices as well as perhaps other types of test stations in the manufacturing cycle. It is understood that the front side of the wafer test head 504, as well as the back side of the wafer test head, may incorporate a means for inserting or attaching the wafer cassette therein or thereon. Such a means may incorporate a slot, clips, a receptacle, grooves, optics or alignment bumps to aid a cassette's proper electrical connection and alignment with a test head. By utilizing a cassette in the test process, the wafer can be more easily aligned or clipped to the probe card. Moreover, the probe card may be incorporated into the wafer cassette. The use of a wafer cassette may also aid in the automation of testing wafers by allowing the wafers to be easily transported and installed and uninstalled in various types of test equipment throughout on the manufacturing line.

The use of a cassette with the wafer in lieu of a probe card requires a lesser number of contacts with the wafer under test as compared to the number of contacts required with a probe card. The use of a cassette in probing the wafer under test is a much less expensive technique for probing the wafers. As the engineers who design integrated circuitry, which ultimately is created on the wafers, incorporate Design for Test (DFT), Built-In Self Tests (BIST), and Built-In Self Repair (BISR) circuitry and other techniques into their designs, the use of cartridges or cassettes for holding and moving wafers under test about on a manufacturing floor becomes more economically and technically feasible for testing wafers in accordance with the embodiments of the present invention. Another design technique called Design for Wafer Test (DFWT) may further decrease the number of test pads that are required for probing on each wafer further enabling additional embodiments of the invention. The use of the DFT, BIST, BISR, and DFWT techniques, when designing integrated circuits, will help to reduce the required number of connections in terms of physical connections, in terms of required resolution, and in terms of the signal frequencies required for testing the various circuits on each wafer.

Figure 6:
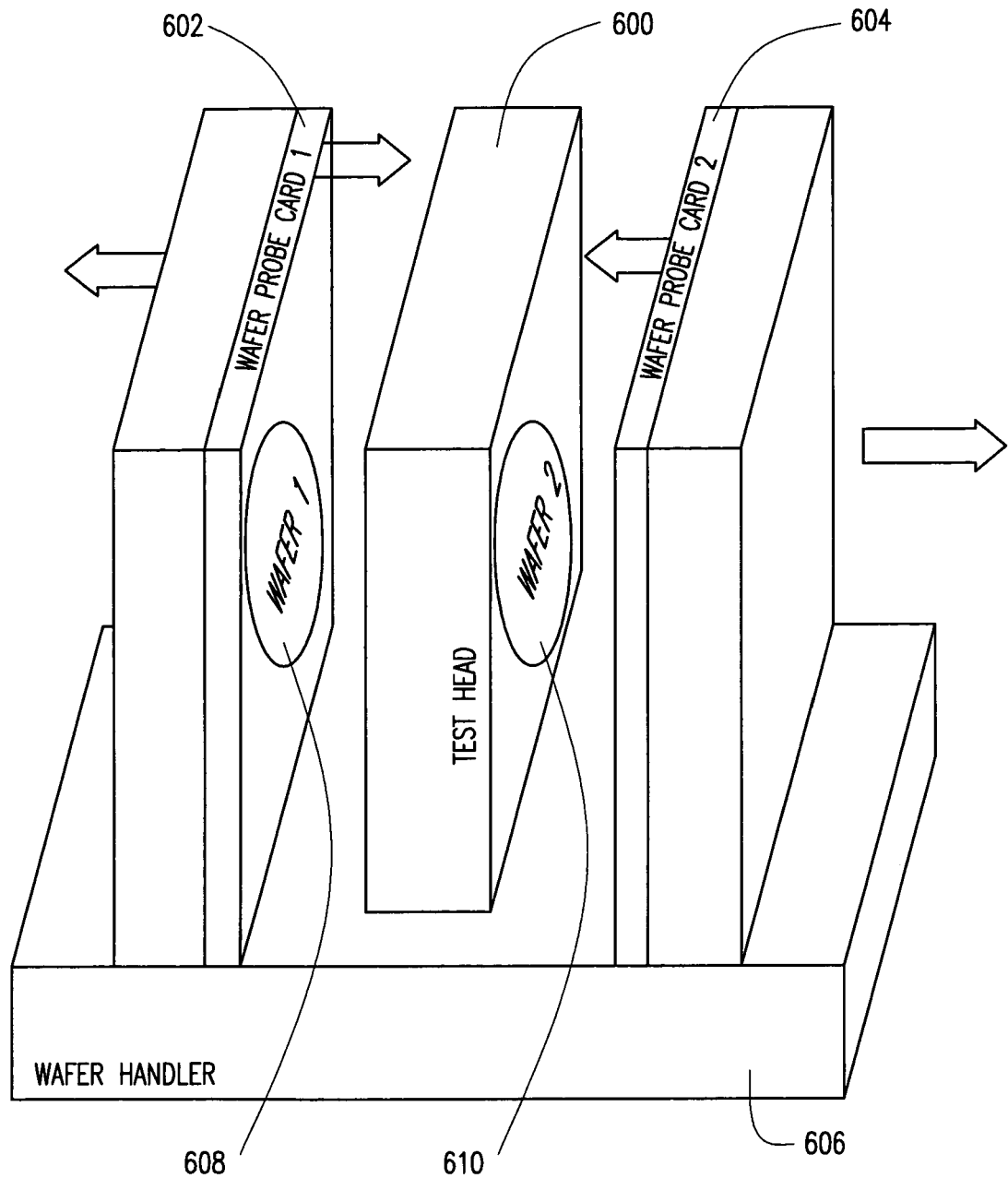
FIG. 6 depicts an exemplary embodiment and method of using an exemplary wafer test head to test a plurality of wafers.

FIG. 6 depicts another exemplary embodiment of the invention and provides a method for using an exemplary test head 600 in accordance with an embodiment of the present invention. In FIG. 6, an exemplary wafer test head 600 is positioned between two wafer probe cards. A first wafer probe card 602 is depicted on the left of the exemplary test head 600. A second wafer probe card 604 is depicted on the right of the test head 600. A wafer handler 606 has the ability to move the wafers toward and away from the wafer test head as depicted by the arrows in the FIG. 6. Alternatively, the wafer test head may move toward and away from each of the wafers 608, 610.

A first wafer 608 and a second wafer 610 can be placed and positioned, via the wafer handler mechanism 606 on to the first wafer probe card 602 and the second wafer probe card 604, respectively. The wafers 608 and 610 may or may not be within a wafer cassette. The wafer handler 606 will then move the wafers toward the wafer probe cards and the test head thereby positioning the first wafer 608 and the second wafer 610 in a proper position for the test head and the respective wafer probe cards. Testing could then be performed using both sides of the wafer test head either alternately or simultaneously to test the first wafer 608 and the second wafer 610.

In an alternative exemplary method for the testing a plurality of wafers, the first wafer 608 may be placed via a wafer handler 606 on the first wafer probe card 602 and the wafer test head 600. The wafer handler 606 may then position the first wafer 608 correctly on the first wafer probe card 602 and the test head 600. Testing of the first wafer may then commence. In the meantime, a second wafer 610 may then be placed and prepared for positioning and placement on the second wafer probe card 604 and wafer test head 600.

The second wafer may then be positioned and placed on the wafer probe card 604 and the wafer test head 600. At this time, the second wafer 610 may have the testing of its circuitry commence thereupon or the test head may interleave testing of the first wafer 608 and the second wafer 610. In either case, testing of the wafers is streamlined by the dual sided wafer test head 600 and index time is substantially eliminated.

Figure 7:
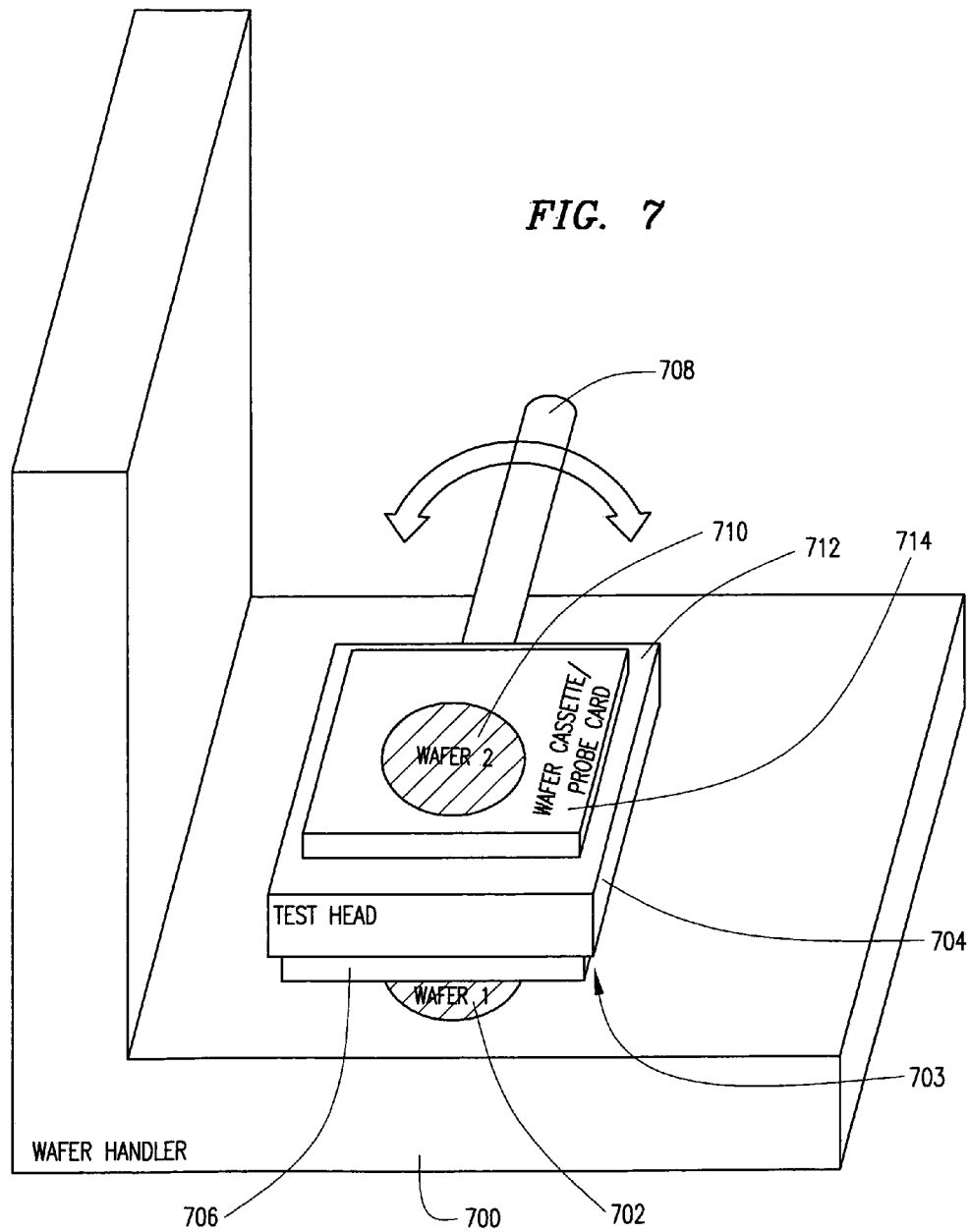
FIG. 7 depicts another exemplary embodiment and method of using a wafer test head to test a plurality of wafers.

FIG. 7 depicts a wafer handler 700 that provides a first wafer 702 to a first side of a wafer test head 704. The handler transports and moves the first wafer 702 into position for the test head 704 to attach the first wafer 702 to its first side 703. A first wafer probe card 706 probes the first wafer 702 and the test head 704 can begin testing of the various integrated circuits on the first wafer 702.

The wafer handler may then move away from the wafer test head to retrieve another wafer for testing. While the wafer handler is retrieving the second wafer, the wafer test head 704 may rotate about 180° on a shaft 708 or other rotational means that uses gears, pulleys, stepper motors, or other mechanical mechanisms to rotate the test head 704 180°. The wafer handler 700 then provides a second wafer 710 and positions the second wafer on the second side 712 of the wafer test head 704. The second wafer may be included within a wafer cassette or be combined with a probe card 714 when it is being attached to the second side 712 of the wafer test head 704.

While the second wafer 710 is being positioned and attached to the wafer test head, the first wafer 702 is being tested using the PCBs within the test head 704 in conjunction with a main chassis that is electrically connected via electrical cables or otherwise to the test head 704. The main chassis may be somewhat similar to the chassis 502 of FIG. 5.

When testing of the first wafer 702 is completed, the wafer test head may rotate another 180° either in the same direction or the opposite direction that it rotated previously, and allow the wafer handler 700 to remove the first wafer from the first side 703 of the wafer test head 704. In the meantime, the second wafer 710 is tested on the test head 704.

In embodiments of the invention, testing of the wafers can be substantially continuous and in an interleaved fashion such that a first wafer is tested while a second wafer is being attached (indexed) to the machine. While the second wafer is being tested and the first wafer has completed its testing cycle, the first wafer will be removed from the wafer test head and a third wafer will then be attached to the wafer test head in its stead.

Wafer cassettes or cartridges can be used to hold the wafers in order to take advantage of a decreased amount of required wafer placement and positioning accuracy for aligning the wafers with the many probe sites on the probe card.

Figure 8:
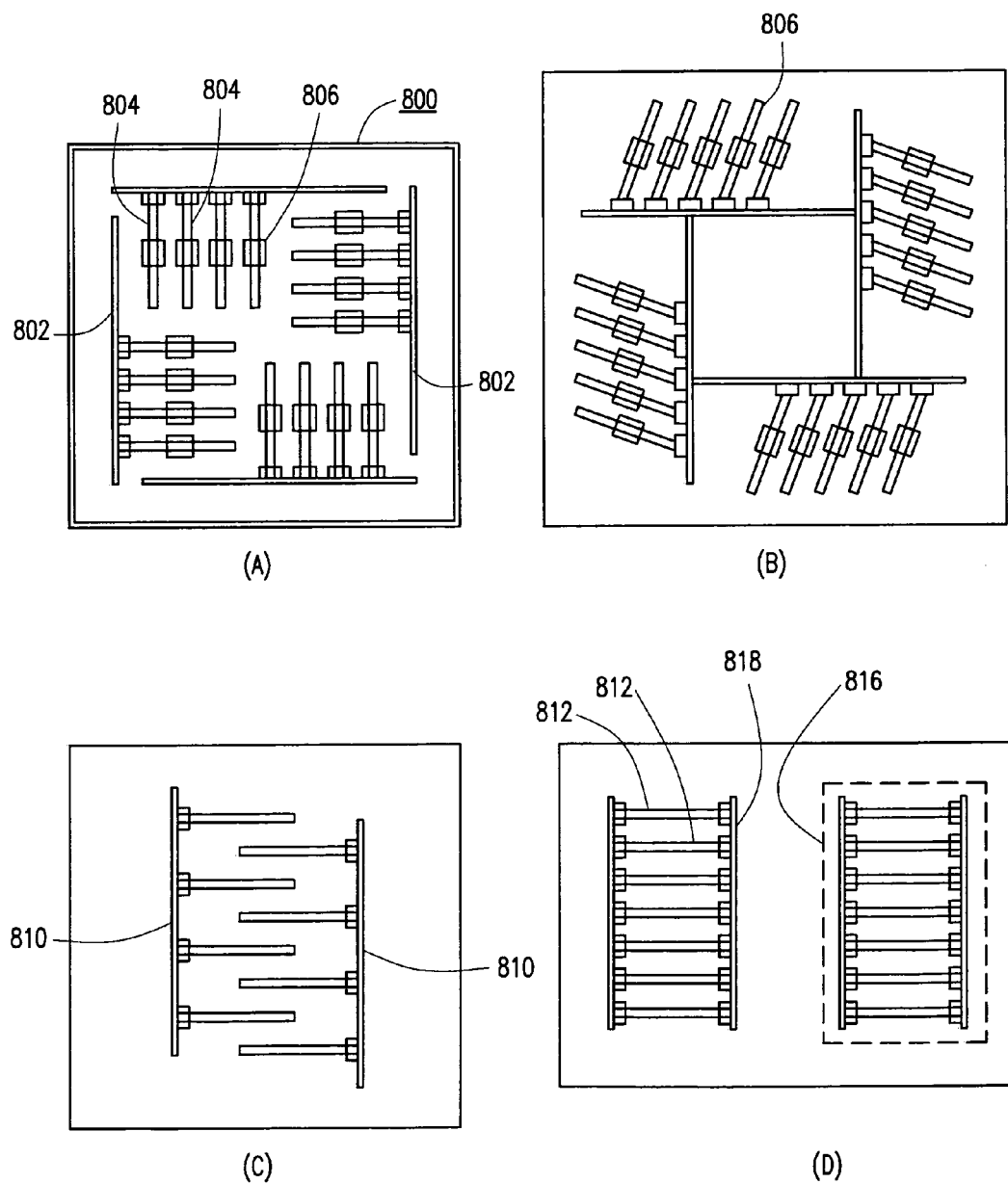
FIG. 8A-8D depict various wafer test head architecture configurations in accordance with some embodiments of the present invention.

Referring now to FIG. 8A-D, additional configurations of an exemplary wafer test head architecture are provided. The views of the test head are from the front side looking into the test head. It can be seen that in all the configurations, the PCBs are positioned to have a first end near the front panel of the exemplary wafer test head and a second end near the back panel of the exemplary wafer test head thereby enabling direct and relatively short distances for electrical connections of the same PCB card to both the front and the back of the wafer test head as discussed above. In FIG. 8A, the exemplary wafer test head 800 has four back planes 802 that provide electrical connections to a plurality of PCBs 804. Each of the PCBs 804 have a connector or electrical connection 806 that is near the front side of the wafer test head 800 as well as a connector or electrical connection area on another portion of each PCB, which is near the back side of the wafer test head (not specifically shown). Each of the PCBs extend from its back plane 802 toward the interior of the wafer test head 800.

In FIG. 8B, the back plane configuration is similar to that of FIG. 4, but the PCBs are in a slanted quadrant configuration in order to allow for an increased size of the PCB in the limited quadrant space.

FIG. 8C depicts two back planes 810 in a parallel configuration. The PCBs extend from their associated back plane toward the other backplane in an interleaved, almost zipper-like fashion. In FIG. 8D, the back plane is organized into a PCB cage or compartment 816 where the PCBs 812 are inserted into slots in the cage 816 and thereby connected to the back plane 818. This configuration may aid in servicing the PCBs within a wafer test head because the cages 816 could be easily removed as a whole from the interior of the wafer test head chassis.

Embodiments in accordance with the present invention provide a multi-sided test head where multiple wafers can be tested for a variety of quality control purposes and circuit integrity reasons on the same test head. By using a multi-sided test head, mass production and testing of mass produced integrated circuits is more streamlined and the test equipment will take less space in the manufacturing facility thereby decreasing overall costs of manufacturing integrated circuits.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A multi-sided wafer test head architecture comprising:
   a front panel for electrically connecting to a first wafer under test and a back panel for electrically connecting to a second wafer under test;
   a first backplane being substantially perpendicular to said front panel and said back panel, said first backplane being spaced from and substantially parallel with a first side panel;
   a second backplane being substantially perpendicular to said front panel and said back panel, said second backplane being substantially parallel to and spaced from a second side panel;
   a first plurality of PCBs electrically connected to said first backplane, said first plurality of PCBs each having a first interface end proximate to said front panel in order to minimize signal delay between said first plurality of PCBs and said first wafer under test and a second interface end proximate to said back panel in order to minimize signal delay between said first plurality of PCBs and said second wafer under test; and
   a second plurality of PCBs electrically connected to said second backplane, said second plurality of PCBs being similar to said first plurality of PCBs in that said second plurality of PCBs also have a first interface end proximate to said front panel and a second interface end proximate to said back panel.

2. The multi-sided wafer test head architecture of claim 1, further comprising:

a third backplane being substantially perpendicular to said front panel and said back panel, said third backplane be being substantially parallel to and spaced from a third side panel; and a third plurality of PCBs electrically connected to said third backplane, said third plurality of PCBs each having a first interface end proximate to said front panel and a second interface end proximate to said back panel.

3. The multi-sided wafer test head architecture of claim 2, further comprising:

a fourth backplane being substantially perpendicular to said front panel and said back panel, said fourth backplane be being substantially parallel to and spaced from a fourth side panel; and a fourth plurality of PCBs electrically connected to said fourth backplane, said fourth plurality of PCBs each having a first interface end proximate to said front panel and a second interface end proximate to said back panel.

4. The multi-sided wafer test head architecture of claim 3, wherein said first plurality of PCBs are positioned between said first backplane and said first side.

5. The multi-sided wafer test head architecture of claim 1, further comprising:

a front probe card, associated with said front panel, for probing said first wafer, and a second probe card, associated with said back panel, for probing said second wafer.

6. The multi-sided wafer test head architecture of claim 1, wherein said first plurality of PCBs are further positioned between said first backplane and said first side panel, and said second plurality of PCBs are further positioned between said second backplane and said second side panel.

7. A wafer test head architecture comprising:

a first wafer test panel, said first wafer test panel having an outside and an inner side a second wafer test panel, said second wafer test panel having an outside and an inner side; the inner side of said first wafer test panel facing the inner side of said second wafer test panel;

a plurality of PCBs positioned between the inner side of the first wafer test panel and the inner side of the second wafer test panel, each of said plurality of PCBs having a first electrical connection area substantially proximate first wafer test panel inner side electrical connections and a second electrical connection area substantially proximate to second wafer test panel inner side electrical connections.

8. The wafer test head architecture of claim 7, further comprising at least one backplane, each of said plurality of PCBs being electrically connected to said at least on backplane.

9. The wafer test head architecture of claim 8, wherein each of said at least one backplane comprises a front side and a back side and wherein each said front and said back sides are not be substantially parallel with said first wafer test panel and said second wafer test panel.

10. The wafer test head architecture of claim 7, wherein each PCB of the plurality of PCBs have said first electrical connection area and said second electrical connection area are substantially at opposing ends of each PCB.

11. The wafer test head architecture of claim 10, wherein each PCB further comprises a backplane connection, for removably attaching the PCB to a backplane, said backplane connection being between said first electrical connection area and said second electrical connection area.

12. The wafer test head architecture of claim 7, wherein a subset of said plurality of said PCBs comprise substantially the same wafer testing circuitry.

13. The wafer test head architecture of claim 7, further comprising:

a first wafer probe card being removably, electrically connected to the outside of the first wafer test panel; and a second wafer probe card being removably, electrically connected to the outside of the second wafer test panel.

14. The wafer test head architecture of claim 13 that is used to aide testing of a first wafer when in contact with said first wafer probe card and a second wafer when in contact with said second wafer probe card.

* * * * *